(12) United States Patent
Rincon et al.

(10) Patent No.: US 6,720,780 B2
(45) Date of Patent: Apr. 13, 2004

(54) HIGH DENSITY PROBE CARD APPARATUS AND METHOD OF MANUFACTURE

(75) Inventors: Reynaldo M. Rincon, Richardson, TX (US); Jerry Broz, Longmont, CO (US); Lester Wilson, Sherman, TX (US); Richard W. Arnold, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 112 days.

(21) Appl. No.: 09/921,169

(22) Filed: Aug. 2, 2001

(65) Prior Publication Data

US 2002/0027443 A1 Mar. 7, 2002

Related U.S. Application Data

(60) Provisional application No. 60/230,048, filed on Sep. 1, 2000.

(51) Int. Cl.[7] .............................................. G01R 31/02
(52) U.S. Cl. ........................................................ 324/754
(58) Field of Search ................................ 324/754, 755, 324/762, 760, 761, 758, 158.1; 439/65, 68, 482, 607; 28/828

(56) References Cited

U.S. PATENT DOCUMENTS 5,565,788 A * 10/1996 Burr et al. .................. 324/762
6,310,483 B1 * 10/2001 Taura et al. ................. 324/754

* cited by examiner

Primary Examiner—Ernest Karlsen
Assistant Examiner—Trung Q. Nguyen
(74) Attorney, Agent, or Firm—Yingsheng Tung; Wade James Brady, III; Frederick J. Telecky, Jr.

(57) ABSTRACT

A high density probe card contact apparatus including a support block fitted into an opening in a probe card, and holding a plurality of fine tipped needles extending inward and below an opening in the center of the block. The needle tips are a noble metal integrally connected with a less costly conductive metal which forms the more widely spaced fingers of the needles, and which terminate in contacts to the probe card. Laser etching defines the fine needle pattern in a thin sheet of the two-metal composition which is secured to a polymeric film. The contact apparatus is assembled by positioning one or more sections of the polymer with needles on the support film.

25 Claims, 3 Drawing Sheets

HIGH DENSITY PROBE CARD APPARATUS AND METHOD OF MANUFACTURE

This application claims benefit of appln. 60/230,048 filed Sep. 1, 2000.

FIELD OF THE INVENTION

This invention relates to the testing of integrated circuits, and more particularly to a method of fabricating a probe card apparatus for the testing of integrated circuits.

DESCRIPTION OF PRIOR ART

Integrated circuits (ICs) are formed as multiple, identical, discrete chips on a semiconductor crystal wafer. Each of the integrated circuit chips is usually tested to determine whether or not it functions as intended prior to cutting the wafer into individual chips. Typically, the chips are tested by computer operated test apparatus that exercises the circuits on the chips, using a testing process commonly referred to as multiprobe testing.

Conventional multiprobe testing employs a probe card which includes a plurality of electrical leads terminating in needles, which in turn make contact with input/output contacts of the various circuit elements on the integrated circuit chip being tested. The chip contacts most often are the pads to be electrically connected to the next level of circuitry, and are called bond pads. In the prior art, it is typical for probe cards to be built by attaching metal needles, such as tungsten to conductive traces on a polymeric ring. The needles or probe elements may be secured to the ring by an adhesive or they may be bonded, as by welding to a blade. An opening is provided in the center of the ring for the needles to extend through, and for aligning the needles to the bond pads. The card is positioned in a probe head which provides electrical connection to the controlling computer, and which mechanically brings the needles into contact with the bond pads on the chip.

The wafer support mechanism moves in and "x" and "y" direction in order to remove contamination, and make ohmic contact. The needles must all fall in the same place in order to assure that each one makes electrical contact with a contact or bond pad on the integrated circuit. This is accomplished by bending the needles after they are mounted on the probe card, which is laborious, time consuming, and expensive.

The close spacing necessary for testing some chips cannot be achieved with conventional needle contacts. In particular, needle contact probe cards are nearly impossible for high density bond pads on ICs where the pad pitch is 75 microns or less, and the density of contacts in the range of 400 or greater per device. The pitch of probe needles, and the angles of their projection necessary for these devices, are extremely difficult to manufacture, and in turn insures a high cost. Further, both delivery and maintenance of such cards adds significantly to the cycle time of testing. As a result of these issues, a number of attempts have been made to provide alternate probe card technology. Much of the newer technology centers around photolithographically defined conductor leads on polymeric membranes with plated or spring loaded contact mechanisms. Each of these approaches must have a means for applying uniform pressure to cause the membrane to make uniform contact across the chip. The issue of uniform contact, as well as alignment is aggravated by thermal expansion of the membrane because very often the chip generates a significant amount of heat during the testing procedure. Further, photolithography definition of the leads adds cost to the testing procedure, not only as a result of the initial cost and multiple steps involved, but also because new artwork and masks are required for each new device and/or change, thus adding to cycle time for production.

Thin film conductors have an added risk of increased inductance to the circuit, which is a significant issue for testing high speed devices. On the other hand, high resistivity of some probe needles, conductor traces, and multiple connections between needles, conductors on the probe card, and conductors to the probe head can also lead to inductance values which impact the accuracy of chip testing.

Because of the aforementioned issues with prior probe card technologies, and because of the anticipation of even tighter pitch of bond pads on integrated circuits of the future, it would be very advantageous for the industry to have a low cost probe contract apparatus, having a rapid means of fabrication, modification, or repair, having low inductance, and very high density of contacts.

SUMMARY OF THE INVENTION

It is an object of the current invention to provide a new and useful probe card contact apparatus which enables connection between a very high density of input/output pads on an integrated circuit chip, and more generously spaced contacts to conductive traces on a probe card of known technology.

It is also an object of the invention to provide a method for rapidly and economically manufacturing a high density probe card contact apparatus.

It is yet another object of the invention to provide a robust probe card contact apparatus which minimizes the amount of maintenance required during and after usage.

It is further an object of this invention to provide a probe card contact apparatus having thermal expansion similar to that of the semiconductor device to be tested so that contact is not compromised as a result of chip heating during testing.

It is an object of the invention to provide a probe card contact apparatus which is compatible with existing probe card technology, and multiprobe tester operation.

Yet another object of the current invention is to provide a reliable, high performance, probe card contact apparatus.

It is further an object of the invention to provide a reliable multipurpose contact apparatus.

The objectives of this invention are met by providing multiple, comb-shaped contact segments, each including a precisely positioned array of needles secured to a polymeric backing, and one or more of the segments positioned on a support block, which in turn is electrically and mechanically connected to a probe card. The needles are formed as integrally connected two-metal structures having tips of a noble or non-oxidizing metal, and fingers of an inexpensive readily available conductive metal. Rapid and low cost patterning of the needles and fingers is accomplished by a combination of chemical etching and high resolution laser processing.

The support block is a dielectric material having a low coefficient of thermal expansion which functions to secure the position of the probes, and to help control thermal expansion mismatches within the probing system, thereby minimizing movement of the probes relative to the chip during testing.

One or more comb-shaped segments of film are adhered to the semi-arc shaped surface of the support block, so that the noble metal needle tips which extend beyond, and are formed downward from the thin central portion of the block, can be brought into contact with the chip contact pads.

Terminals of the fanned out, common metal needle fingers extend onto the support block, and mate with contacts on a conventional printed circuit probe card. The support block is fitted into an opening in a probe card where the widely spaced fingers are connected to conductive traces on the probe card.

Precisely positioned needles are formed by patterning and etching a sheet of a two-metal composition, having one edge of a noble metal integrally attached to a less noble, conductive metal. High resolution, ease and low cost fabrication, and customized patterns are achieved by software input of the particular IC's input/output pads, and the probe needle design into a fine beam laser for removing metal where the feature size is less than 100 microns. Patterning of features greater than 100 microns is achieved by photopatterning and chemically etching the two-metal structure.

In an alternate embodiment, a film of a laser ablatable material is deposited on the surface of the two-metal sheet, and the laser ablates a mask for subsequently patterning the and removing the excess metal from the two-metal sheet, and forming the needles. The fine beam of currently available lasers easily meets the tight pitch requirements of chip pads both in current production and those planned for the future.

Rapid response cycle time is achieved by assembling a few polymeric segments with probe needles onto a support block and fitting into a probe card, rather than attempting to align and assemble hundreds of probe needles on a card. Software input of design, coupled with laser processing is a significant factor in the ability to respond rapidly to the need for new probe cards designs, and the manufacture of high density, and/or high performance probe card apparatus. A two-metal needle structure combines highly reliable, noble metal tips with low cost fingers which may further be optimized for performance.

The foregoing and other objectives, features and advantages will become more apparent from the following detailed description of preferred embodiments of the invention which proceeds with reference to the accompanying drawings.

DETAILED DESCRIPTION OF THE INVENTION

Figure 1:
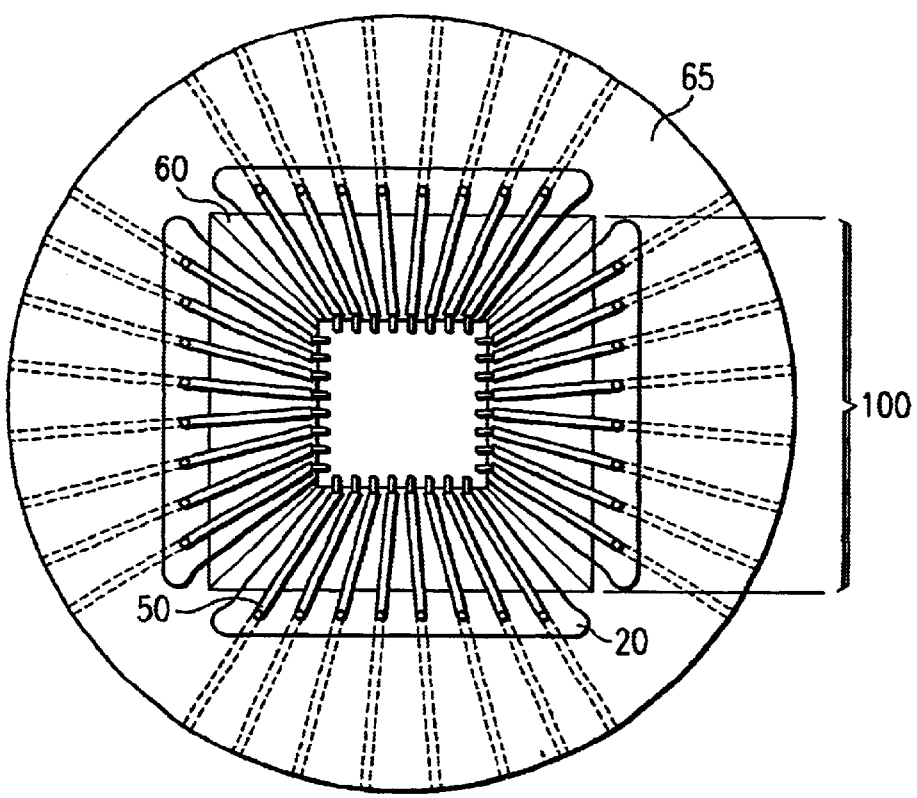
FIG. 1 is a plan view of a probe card contact apparatus of the current invention positioned in a probe card.

In FIG. 1 a probe card contact apparatus 100 of the current invention includes a plurality of two-metal needles 50 precisely arrayed and secured on a polymeric film segment 20, one or more film segments attached to a support block 60, which fits into a probe card 65 of existing technology.

Figure 2:
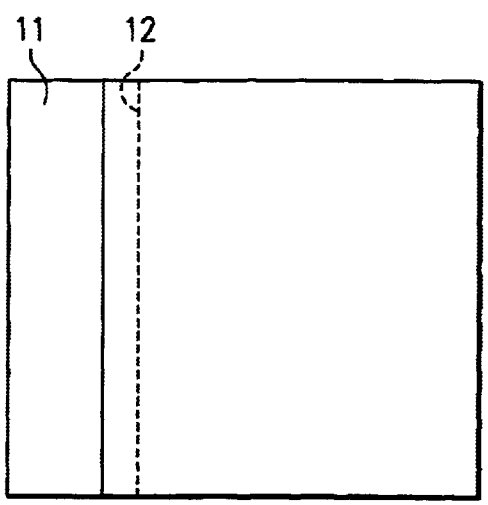
FIG. 2 is a sheet of two-metal composition fabrication of probe needles of the current invention.

FIG. 2 illustrates a two-metal sheet used in fabrication of a high density, low cost probe card contact apparatus. The two-metal sheet structure includes on one edge a narrow section 11 of a noble metal integrally connected to a larger section 12 of a relatively low cost conductive metal, such as copper/beryllium. The term "noble" metal will be used to refer to a metal which is self limits oxidation to a thin film, such as a palladium or rhodium alloy, In an alternate embodiment, the two-metal sheet is a conductive metal, such as copper/beryllium with a narrow section of a more noble metal plated or laminated to one edge.

The metal sheet is in the range of 0.00075 to 0.003 inches thick. Width of the noble metal section 11 is a minimum of 0.050 inches, whereas width of the total sheet structure 10 is about 0.5 to 2.0 inches.

Noble or self limiting oxidation metal probes have been shown to be non-oxidizing contacts which provide good electrical contact with minimal scrubbing of aluminum or copper chip pads, both before and after thermal exposure to heat generated both during testing, and/or from testing at elevated temperature. See Broz, J. J., et al., "Probe Contact Resistance Variations During Elevated Temperature Test" Proceedings of IEEE—International Test Conference 1999, Atlantic City, N.J. pp396–405. The cost of fabricating full probes of a noble metal is excessive, however, only a small area is required for needle tips. The two metal sheet having a less dear, highly conductive material used for the bulk of the needle composition provides a relatively low cost needle material solution.

Figure 3:
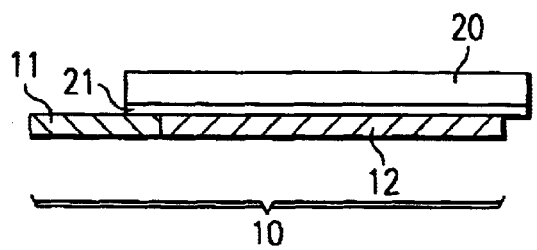
FIG. 3 is a cross section of a polymeric film supporting the two-metal sheet.

FIG. 3 depicts a cross section the metal sheet 10 affixed to a flexible polymeric film 20 with the noble metal portion 11 at least partially extending beyond the plastic film. The polymeric film is a dielectric material about 0.001 to 0.003 inches thick having thermal stability to greater than 150 degrees C. Polymers of the polyimide family are preferred film choices because of their thermal stability, low coefficient of thermal expansion, and outstanding dielectric properties. The metal is preferably affixed by a thin layer of adhesive 21.

Figure 4:
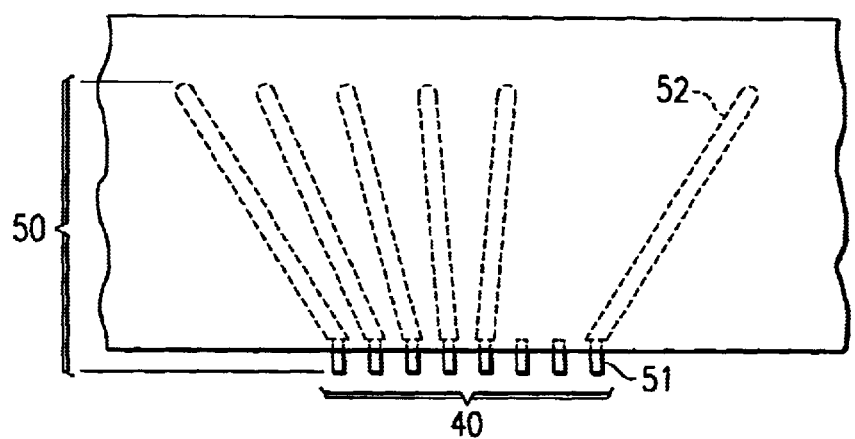
FIG. 4 shows etched probe needles attached to a sheet of polymeric film of the current invention.

FIG. 4 provides an exemplary design of probe structures 50, including contact needles 51, broader and more widely spaced fingers 52 fanned out with respect to the closely spaced needle tips, and a polymeric film 20. Tips are closely spaced to correspond to the location of chip input/output pads, whereas the fingers mate to contacts on a probe card fabricated from technology not yet capable of the tight spacing typically found on IC chips. In a preferred embodiment, the design of a probe structure is photopatterned using the technology typically found in printed circuit or flex circuit fabrication. For probe structures having feature sizes less than about 100 microns, the design is input to the computer of a fine beam laser, and laser ablation used to define the fine features, as well as to complete removal of any excess metal to form probe needles 50, including fingers 52 and tips 51, isolated from each other by the dielectric polymer film 20.

In an alternate embodiment, a layer of a material which can be laser etched, such as tin or selected polymers, deposited on the exposed surface of the metal sheet is laser ablated leaving a patterned mask of the desired needle array design. Subsequently, the two-metal sheet is chemically etched using the mask. Width of the needle tips 51 is in the range of 0.00065 to 0.002 inches; this requirement is readily satisfied by lasers having spot sizes of about 30 microns.

Figure 5:
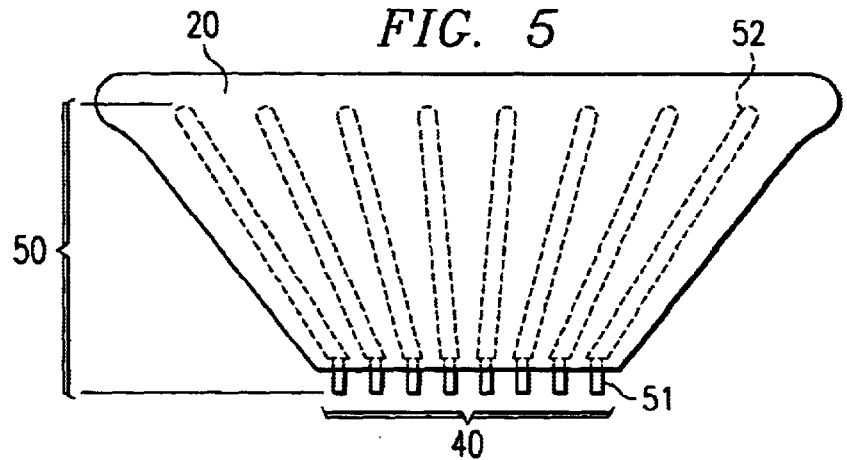
FIG. 5 is a single comb segment of the current invention.

In FIG. 5, the polymeric film with needles is stamped or punched to form a somewhat comb-shaped segment or structure 40, wherein the probe needles 50 are the teeth, and the polymeric film 20, the securing base. The comb segment 40 has exposed needle tips 51, attached to wider conductive fingers 52, and held together by the polymer 20.

Figure 6:
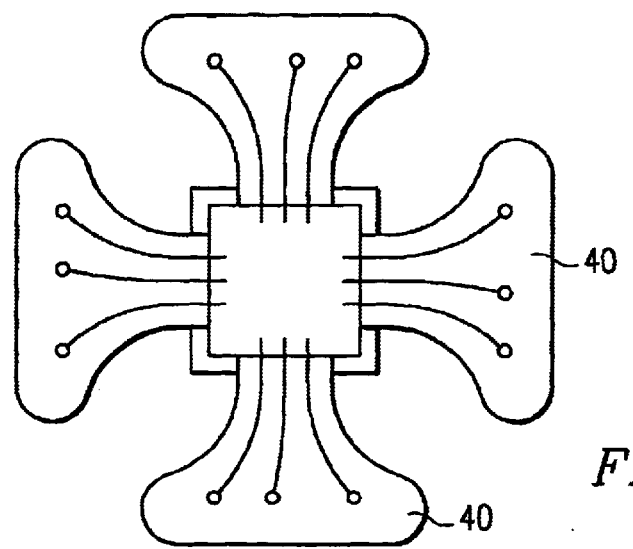
FIG. 6 is a top view of four comb segments assembled in a square configuration.

Usually multiple comb structures with probe tips and conductive fingers are fabricated for a single probe card. An embodiment shown in FIG. 6 assumes a square chip pad array, and the apparatus has one comb structure 40 in each of 4 quadrants of the probe contact apparatus. In an alternate embodiment wherein a rectangular chip is the device under test, and bond pads are arrayed along the long sides, only two comb structures are required. In yet another embodiment, the comb structures could form a hexagonal or octagonal array.

The probe needles provide the contacts and connections necessary between the chip and probe card, and the needle designs are not necessarily identical for multiple comb structures on a given probe contact apparatus.

Figure 7A:
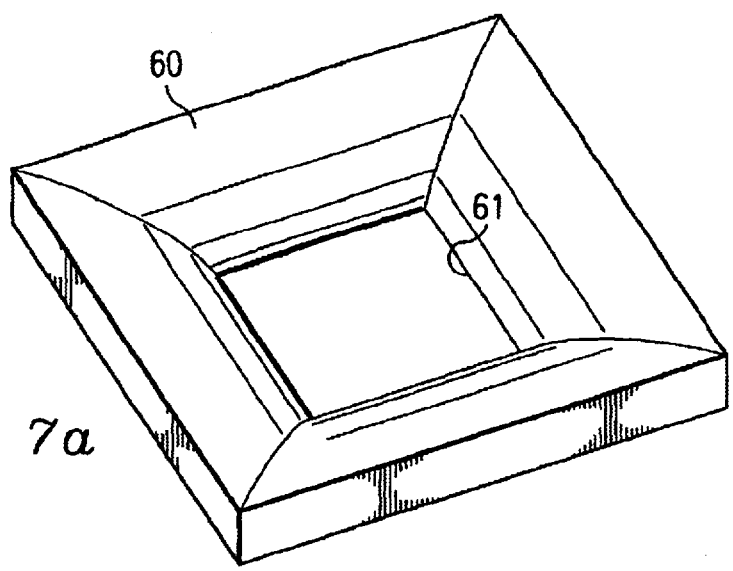
FIG. 7a shows a support block for a probe card contact apparatus of the current invention.

FIG. 7a is a support block 60 having a centrally located opening 61. In a preferred embodiment, the support block has a square perimeter with a square opening. One major surface has a curved or semi-arc shape, wherein the more elevated outer edges slope toward the central opening. Curvature of the surface is more gradual, to nearly flat near the perimeter, hence, the term "semi-arc" shaped. The shape of the second major surface is not critical, but preferably is planar. The block is a dielectric material having thermal expansion coefficient in the range of 2 to 8 PPM, preferably a ceramic material. Alternately, a number of composite polymers are available to provide the required properties.

Figure 7B:
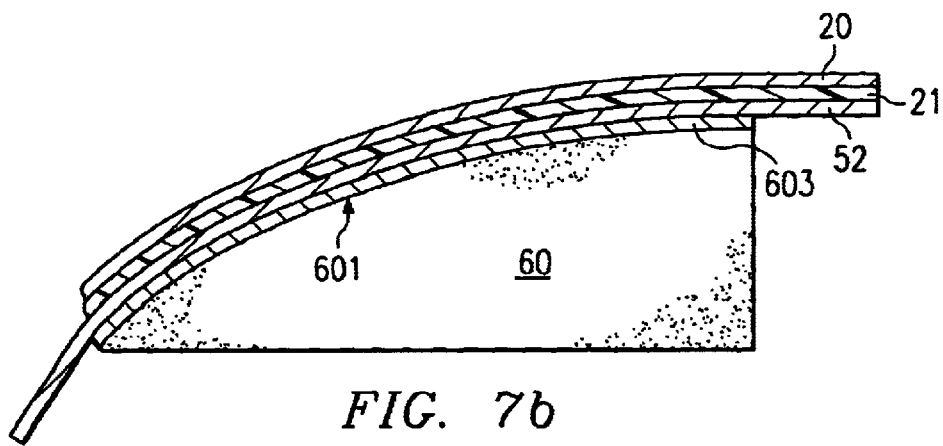
FIG. 7b is a cross section of a probe card contact subassembly of the current invention.

FIG. 7b shows a cross section of the novel probe contact sub-assembly including a polymeric film 20 with a thin adhesive layer 21, and probe fingers 52. The probe fingers 52 are attached to the first surface 601 of a support block 60 by a thin film of adhesive 603, preferably applied to the surface 601 of the block. Metal fingers 52 extend beyond the support block and adhesive 603. The preferably ceramic support block 60.

Figure 8:
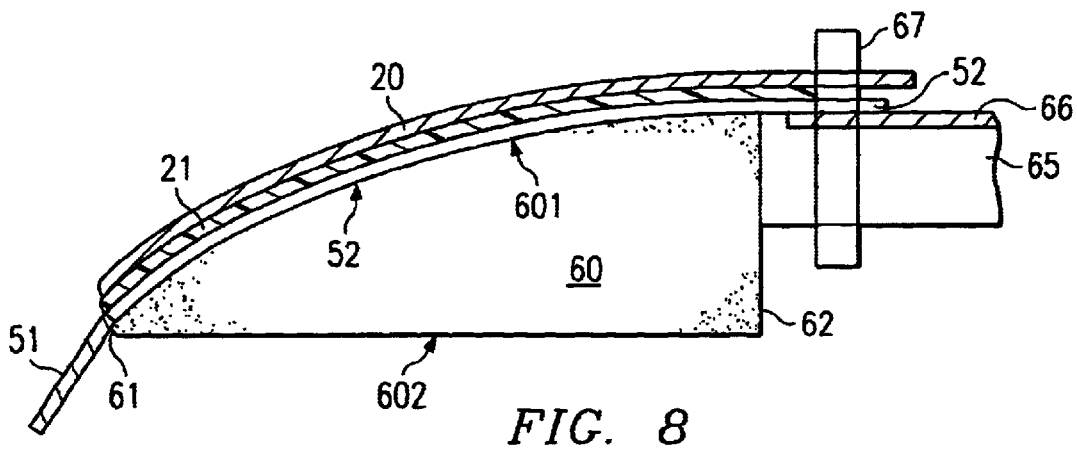
FIG. 8 is a cross section of a probe card contact subassembly positioned in a probe card.

A cross section of the sub-assembly fitted into an opening in a conventional probe card 65 is shown in FIG. 8. The probe card contact needle tips 51 extend beyond and below the thinned opening in the support block, and the fingers extend beyond the outer perimeter so that they can be brought into contact with a conductive trace 66 on the probe card 65. Support block 60 is fitted into an aperture in the probe card, and is secured by a mechanical clamping structure 67.

The first surface 601 of the block has a semi-arc shape with the thinned portion terminating in a centrally located opening in the block. Shape of the second surface 602 is not critical, and may be flat as illustrated. The vertical outer surface 62 opposite the central opening parallels an opening in the probe card 65. Typically, the thickness at the outer perimeter of the support block is in the range of 0.2 to 0.5 inches, and at the opening is about 0.1 to 0.3 inches. However, thickness of the support block is related to the probe card thickness. Fingers 52 on the upper surface 601 of the support block are positioned atop the upper surface of the probe card 65, and are and brought into contact with conductive traces 66 on the card. The second surface 602 of the support block is positioned below the probe card, thereby allowing short exposed needle tips to be brought into intimate contact with pads on the chip under test. It is, therefore, obvious that the support block is constructed for a given probe card configuration.

The metal bearing surface of the comb structure is positioned atop the support block. And adhered by an adhesive film 603, so that tips of the probe needles 51 overhang the opening 61, and are formed downward to extend below the surface 602 of the block. Probe needle tips 51 are positioned to contact chip input/output pads (not shown).

The resulting probe card including a plurality of noble metal probe needle tips integrally connected to less costly probe fingers is attached to a dielectric film, which in turn is adhered to a formed support block, and the assemblage is positioned into a conventional probe card. An assemblage of a few comb structures, rather than hundreds of individual needles provides a rapidly and accurately assembled high density probe card. The embodiment illustrated in FIGS. 1 and 6 has shown four (4) segments on a square support block, but the invention is in no way limited to a square structure, but could instead have only two parallel segments, or could have six or eight on hexagonal or octagonal devices.

A high performance embodiment of the probe contact apparatus includes customized probe fingers wherein the dimensions are designed to provide or approach a specific impedance level. Further optimization of the impedance level can be achieved by providing a ground plane on the surface of the polymeric film opposite the probe fingers. A metal film is pattered and etched in the same manner as the probe fingers to form a ground ring or plane using the polymeric film as the dielectric medium separating the conductors.

The probe contact apparatus of the current invention provides a number of innovative advantages to the semiconductor industry. The method of manufacture lends itself to relatively low cost and rapid cycle time, necessary to respond to the fast paced introduction of chip designs for both new and revised products. The method for manufacture includes the following steps.

First, a two-metal sheet having a narrow strip of noble or limited-oxidizing metal on one edge in intimate contact with a larger, low cost, and easily processed metal is provided, thus a reliable and affordable probe material solution is realized. A thin polymeric film attached by an adhesive layer supports the bulk of the metal sheet during processing, and subsequent assembly onto a support block and probe card.

Critical pad locations and dimensions based on precisely on those of the chip are provided as the design for photolithographically patterning the needles. The excess metal is chemically etched. For feature sized less than about 100 microns, software input of critical pad locations and dimensions based precisely on those of the chip design, probe card contact positions, and in some embodiments, customized impedance constraints are input to a computer controlled laser. Laser ablation is used to define the fine features, as well as to remove the excess metal from partially etched patterns. The patterning technique allows the conductive fingers to be positioned as desired, and to be configured for optimum electrical performance.

In a second embodiment, a thin film of a laser ablatable material is deposited on the two-metal sheet, and the software generated pattern is input to a computer controlled laser for defining a mask. The resulting mask can be patterned within a matter of minutes by ablating the film using a fine beam laser. The thin two-metal sheets are chemical etched to economically form a high density of probe needles.

While laser ablation coupled with chemical etching of unwanted metallization is the preferred method of forming the needle pattern, any of a number of alternatives are available in the industry.

In the next process step, the polymeric film with a plurality of probes is punched, and the comb shaped segment is positioned atop a support block. A formed support block of a material having a low coefficient of thermal expansion, and a low dielectric constant supports the probes, and allows one end to be brought into contact with corresponding conductive traces on a probe card, and the opposite end with the chip bond pads.

Probe needle tips extending below the card assemblage are brought into contact with chip pads by positioning and lowering the card and contact apparatus. Alignment may be partially or totally viewed through the centrally located opening in the support block. These features require little to no operator retraining from existing probe needle technology.

The probe contact apparatus of the current invention is aligned to and fitted into a probe card of known technology. The low expansion support block minimizes movement of the probe needles during testing as a result of thermal expansion within the system. Snap-in of the support block with mechanical pressure contact between the probe fingers and probe card contacts allows rapid change out of the probe contact apparatus for maintenance.

The two-metal contact needle held on a dielectric polymer has been described with reference to testing of integrated circuit chips, but the usefulness of such a structure is not limited to this application, but instead may be applied as a low cost, robust and reliable contact mechanism for multiple applications. The sub-assembly including one or more segments of two-metal needles supported and separated by a dielectric film is secured on a substrate with the needle tips exposed. The needles are electrically isolate from the substrate. The substrate surface may be curved with needles extending below the substrate as illustrated in the probe card sub-assembly in FIG. 7b, or may simply be flat and parallel. One such application, also related to the integrated circuit testing field is a burn-in contact mechanism, wherein the noble metal tips are held contact with a packaged semiconductor device for aging under electrical and thermal stress. The sub-assembly is isolated from a substrate, preferably by a thermally stable dielectric film having adhesive on both major surfaces. Alternately, a relatively thick film of non-conductive adhesive provides the necessary insulation.

The invention has been described with reference to specific embodiments, but it is not intended to limit the scope to a particular form set forth, but on the contrary, it is intended to cover alternatives, modifications, and equivalents as may be included within the spirit of the invention as described by the appended claims.

What is claimed is:

1. A probe card contact apparatus including in combination:
    a support block, having a curved shape on one major surface, a planar second surface, and an opening in the center,
    one or more comb assemblages having a plurality of two-metal probe needles adhered to the first surface of a polymeric film segment wherein the fine tips of the needle extend beyond the film, and the fingers on the opposite end are secured atop the curved surface of said support block, and
    a probe card having an opening fitted to said support block perimeter and a plurality of conductive traces corresponding to said probe finger terminations.

2. An apparatus as in claim 1 wherein said two-metal probe needles comprise a noble metal or a metal having surface oxidation integrally connected with conductive metal fingers of a different composition.

3. An apparatus as in claim 1 wherein said two-metal needle probes comprise a single conductive metal having a noble metal deposited on the tips.

4. An apparatus as in claim 1 wherein said needle tips extending beyond the film and said central opening in the support block are formed downward below the level of said block.

5. An apparatus as in claim 1 wherein said noble metal tips are in the range of 0.00075 to 0.0015 inches thick.

6. An apparatus as in claim 1 wherein said noble metal tips are a minimum of 0.050 inches long.

7. An apparatus as in claim 1 wherein the width of probe needle tips is in the range of 0.00075 to 0.002 inches.

8. An apparatus as in claim 1 wherein said noble metal comprises palladium.

9. An apparatus as in claim 1 wherein said noble metal comprises rhodium.

10. An apparatus as in claim 1 wherein said noble metal comprises gold.

11. An apparatus as in claim 1 wherein said second metal comprises a beryllium and copper alloy.

12. An apparatus as in claim 1 wherein said needle fingers are spaced further apart than the needle tips.

13. An apparatus as in claim 1 wherein said polymeric film is a thermally stable dielectric material.

14. An apparatus as in claim 1 wherein said polymeric film is in the range of 0.001 to 0.003 inches thick.

15. An apparatus as in claim 1 wherein said polymeric film is of the polyimide family.

16. An apparatus as in claim 1 wherein said support block comprises a dielectric material having a coefficient of thermal expansion in the range of 2 to 8 PPM.

17. An apparatus as in claim 1 wherein said support block comprises a ceramic material.

18. An apparatus as in claim 1 wherein said support block comprises a composite polymer.

19. An apparatus as in claim 1 wherein said the outer perimeter of said support block conforms to an opening in a probe card.

20. An apparatus as in claim 1 wherein said needle fingers are customized to optimize impedance of specific needles.

21. An apparatus as in claim 1 further including a ground plane patterned on the second surface of said polymeric film.

22. An apparatus as in claim 1 wherein the needle pattern is software generated and input to a laser.

23. An apparatus as in claim 1 wherein the needles are at least partially formed by laser ablation.

24. A contact apparatus including:
    a support block, having a curved shape on one major surface, and a planar second surface,
    one or more comb assemblages having a plurality of two-metal needles adhered to the surface of a dielectric film with the needle tips extending beyond the film, and the fingers secured to the curved surface of said support block.

25. A contact apparatus including:
    a support block, having two parallel major surfaces,
    one or more comb assemblages having a plurality of two-metal needles adhered to the surface of a dielectric film with the needle tips extending beyond the film, and the fingers secured to one of the major surface of said support block.

* * * * *